US006303513B1

(12) United States Patent
Khan et al.

(10) Patent No.: US 6,303,513 B1
(45) Date of Patent: Oct. 16, 2001

(54) METHOD FOR CONTROLLING A PROFILE OF A STRUCTURE FORMED ON A SUBSTRATE

(75) Inventors: Anisul Khan; Ajay Kumar, both of Sunnyvale; Dragan V. Podlesnik, Palo Alto; Jeffrey D. Chinn, Foster City, all of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/326,334

(22) Filed: Jun. 7, 1999

(51) Int. Cl.$^7$ .................................................. H01L 21/00
(52) U.S. Cl. ........................... 438/714; 156/345; 216/67; 216/79; 438/719; 438/734
(58) Field of Search ................................... 438/714–719, 438/734–735; 216/2, 39, 67, 79; 156/345 P

(56) References Cited

U.S. PATENT DOCUMENTS

| | | | |
|---|---|---|---|
| 5,592,412 | 1/1997 | Kleinhenz et al. | 365/149 |
| 5,605,600 | 2/1997 | Muller et al. | 156/643.1 |
| 5,665,622 | 9/1997 | Muller et al. | 438/243 |
| 5,674,409 | 10/1997 | Muller | 216/41 |
| 5,851,926 | 12/1998 | Kumar et al. | 438/174 |
| 6,103,585 | * 8/2000 | Michaelis et al. | 438/714 X |
| 6,127,278 | * 10/2000 | Wang et al. | 438/714 X |

OTHER PUBLICATIONS

Etching on silicon membranes for Sub–0.25–μm x–ray mask manufacturing, K. Paul Muller and Nicholas K. Eib, J. Vac. Sci. Technol. B. vol. 11, No. 6 Nov./Dec. 1993.

Dry etch challenges of 0.25 μm dual damascene structures, R.F. Schnabel; D. Dobuzinsky, J.Gambino; K.P.Muller, F. Wang, D.C. Perng, H. Palm, Elsevier science B.V. P11 S0167–9317(97) 00094–4.

Selectivity and Si–Load in Deep Trench Etching, K.Paul Müller, Klaus Roithner, Hans–Jörg Timme, Elsevier Science B.V. SSDI 0167–9317(94)00145–6.

Defect studies on single and bilayer resist systems, K.Paul Muller and Harbans S. Sachdev, J. Vac. Sci. Technol. B 10(6), Nov./Dec. 1992.

Plasma–etching processes for ULSI semiconductor circuits, K.P. Muller, IBM J. Res. Develop. vol. 43 No. 1/2 Jan./Mar. 1999.

M. Armacost et al "Plasma–etching Processes for ULSI Semiconductor Circuits," *IBM J. Res. Develop*, vol. 43, No.1/2 pp. 39–69 (Jan./Mar. 1999).

K. Paul Muller et al "Selectivity and Si–Load in Deep Trench Etching," *Microelectronic Engineering 27*, pp. 457–462 (1995).

Schnabl R.F. et al, "Dry etch challenges of 0.25 μm dual damascene structures", *Microelectronic Engineering 37/38*, pp. 59–65 (1997).

K.P. Muller et al., "Etching On Silicon Membranes For sub–0.25–μm x–ray Mask Manufacturing", *J. Vac. Sci. Technol. B*, 11(6) pp. 2270–2274 (Nov./Dec. 1993).

* cited by examiner

*Primary Examiner*—William A. Powell
(74) *Attorney, Agent, or Firm*—Townsend Townsend and Crew

(57) ABSTRACT

A method for controlling a profile of a structure formed on a substrate using nitrogen trifluoride ($NF_3$) in a high density plasma (HDP) process. Changing the amount of $NF_3$ in the plasma controls the profile of the structure. It has been found that the best results are obtained with an inductively coupled plasma wherein the ion density is at least $10^{12}$ ions/cm$^3$. The method is particularly suited to etch processes such as deep trench etch in silicon wafers.

22 Claims, 6 Drawing Sheets

US 6,303,513 B1

METHOD FOR CONTROLLING A PROFILE OF A STRUCTURE FORMED ON A SUBSTRATE

BACKGROUND OF THE INVENTION

The invention relates to manufacture of integrated circuits. More particularly, the invention relates to etching deep trenches in semiconductor wafers.

As structures fabricated upon semiconductor wafers are reduced in size, etching of deep trenches for applications such as logic devices and dynamic random access memories (DRAM's) has become a serious challenge. Such deep trenches are typically formed by a photolithographic process requiring a plasma etch. The substrate is typically made of a semiconducting material such as silicon. The trench is then filled with a material, such as polysilicon to form what is known as a trench capacitor. Such trench capacitors are used, for example, for storing charge in a memory cell of a DRAM. In other applications, such as deep trench isolation, the trench may be filled with a dielectric.

FIG. 1 shows a partially-formed trench capacitor. The capacitor 100 comprises a trench 102 formed in a silicon substrate 104. The trench 102 is filled with a polysilicon material 106. The trench 102 has an upper wall 108 and a lower wall 110. The upper wall 108 forms a taper angle α with respect to a horizontal 111. In DRAM applications the lower wall 110 and bottom 112 are typically coated with a thin (approximately 200 Å) layer of dielectric known as a node 118. The upper wall is typically coated with a somewhat thicker (about 300 Å) layer of dielectric often called a collar 120. The node 118 and collar 120 are both typically made of a silicon oxide $Si_xO_y$ deposited by methods known in the art. The lower wall 110 forms a taper angle β with respect to a horizontal line 113. There are often different requirements for the taper angles α and β. For example, when filling the trench 102 with the polysilicon material, a seam tends to form near the top of the trench. It is typical for DRAM manufacturers to require that the angle α generally be made less than 89° to prevent seam formation during trench fill. To maximize the surface area of the capacitor, DRAM manufacturers typically require that the angle β generally be made as large as possible. Thus, the angle β is generally larger (i.e., more vertical) than the angle α. As a result a width b of the trench 102 is approximately the same at a bottom 112 as a width a at an interface 114 between the upper and lower walls. However, a width c of the trench at a top 116 is typically larger than widths a or b. This is particularly important when a depth d of the trench is large compared to width a or b.

One known method for forming a trench such as trench 102 depicted in FIG. 1 is to etch the trench with a plasma containing hydrogen bromide (HBr) and oxygen ($O_2$) diluted with helium (He) in a magnetically enhanced reactive ion etching (MERIE) chamber. This process uses a transverse magnetic field to enhance the electron concentration in a capacitively coupled plasma. Such a plasma has a pressure of approximately 100 to 200 millitorr and an ion density on the order of $10^9$ ions/cm$^3$. The $O_2$, together with Si-containing etch byproducts such as silicon oxybromide ($Si_xO_yBr_z$) forms a passivation layer on the walls 108 and 110 of the trench 102. The deposition of this layer determines the trench profile (i.e., the angles α and β). In the HBr/$O_2$/He process described above, the deposition of the passivation layer is controlled by varying the ratio of HBr to $O_2$. Thus, the angles α and β were also controlled by varying the ratio of HBr to $O_2$.

One problem associated with the HBr/$O_2$/He process is the formation of a polymer that builds up on the bottom 112. The polymer interferes with the etch process. To overcome this, one known trench forming method adds $NF_3$ to the HBr/$O_2$/He chemistry to break up the polymer. Profile control in this method is still achieved by varying the ratio of HBr to $O_2$.

Another known process for forming a trench uses a HBr/He/$O_2$ etch chemistry in a first etch step followed by a second etch step that uses HBr with sulfur hexafluoride ($SF_6$) and $O_2$. The first step a etches an upper portion of the trench with a smaller, i.e., less vertical taper angle. The second step etches a lower portion of the trench with a more vertical angle of taper. Alternatively, the second etch step may include silicon tetrafluoride ($SiF_4$) to increase hardmask selectivity as part of the etch chemistry. Both steps of this process are performed using high density plasma (HDP). In HDP the ion density is typically on the order of $10^{12}$ ions/cm$^3$.

Although the above described techniques provide relatively high etch rates (e.g., 1–4 microns/minute depending on feature size) and effective profile control, they are relatively dirty processes, i.e., they produce a polymer that builds up on the inside walls and lid of the chamber. The polymer buildup leads to production of particles that can contaminate wafers and reduce wafer yield. Generally, the more $O_2$ in the HBr/$O_2$/He chemistry the dirtier the process. The $SiF_4$ used in the HBr/$SF_6$/$O_2$ process tends to make the process dirty, i.e., they produce particles that contaminate the wafer and/or the process chamber. Consequently, the processing chamber must often be cleaned after processing each wafer. Although the chamber can be cleaned with a conventional plasma treatment, e.g., using $NF_3$, the frequency of such cleaning reduces wafer throughput, increases cost per wafer and, consequently, reduces profitability.

One other known method of etching includes nitrogen trifluoride ($NF_3$) along with Chlorine, HBr and He/$O_2$ in a low-density, capacitively coupled plasma. This method has been used to etch transistor gates comprising tungsten silicide and polysilicon with an overlying hardmask of silicon oxide. $NF_3$ is added to the etch recipe to improve etch selectivity. In this method trench profile is often controlled by varying the substrate temperature. The etch rates are relatively low (e.g., 2000–3000 Å/min).

Therefore, a need exists in the art for a cleaner, high-etch-rate method of controlling trench profiles during deep trench etching.

SUMMARY OF THE INVENTION

The method of the present invention provides for improved profile control of trenches etched in a substrate and overcomes the disadvantages associated with the prior art. The method utilizes a gaseous mixture containing nitrogen trifluoride ($NF_3$) in a plasma to process the substrate. Changing an amount of $NF_3$ in the plasma controls the profile of the structure. The method is particularly suited to etch processes such as deep trench silicon etch in semiconductor wafers.

The method includes providing a gaseous mixture containing nitrogen trifluoride ($NF_3$) to a chamber containing the substrate. In a preferred embodiment, $NF_3$ is included in a gaseous mixture with HBr, and He/$O_2$ to form plasma for deep trench etching. Energy provided to the gaseous mixture forms a plasma proximate the substrate. Preferably, the plasma is a high density plasma having a plasma density greater than $10^{11}$ charged particles/cm$^3$ and generally between $10^{12}$ and $5 \times 10^{13}$ ions/cm$^3$. More preferably the high density plasma has an ion density of at least $10^{12}$ ions/cm$^3$. The plasma etches a trench in a silicon substrate. The etch profile is controlled by changing an amount of NF$_3$ in the gaseous mixture. In a preferred embodiment, the etch process is a deep trench etch process. The steps of the method an be repeated many times either on the same wafer or on different wafers, before it is necessary to clean the chamber.

An alternative embodiment of the method of the present invention, controls a profile of a trench etched in a silicon substrate. In the alternative embodiment a first etchant gas containing nitrogen trifluoride (NF$_3$) flows to a substrate processing chamber and forms a first high density plasma. The plasma etches a trench in the silicon substrate. The plasma etches the trench such that the trench has an upper wall that forms a first angle with a horizontal. Subsequently, a second etchant gas flows to said chamber to form a second high density plasma. The second etchant gas has a reduced content of NF$_3$ relative to the first etchant gas. Alternatively, the second etchant gas contains no NF$_3$ at all. The second high density plasma further etches the trench such that the trench has a lower wall that forms a second angle with the horizontal that is greater than the first angle.

Preferably, the first etchant gas contains hydrogen bromide (HBr), nitrogen trifluoride (NF$_3$), helium (He) and oxygen (O$_2$). A high density plasma formed from the first etchant gas etches an upper portion of a trench in the silicon substrate. The upper portion has a first sidewall angle that is less than 89° with respect to a horizontal. Subsequently, a second etchant gas flows to the chamber to form a high density plasma to etch a lower portion of the trench. The lower portion has a second sidewall angle that is greater than the first sidewall angle. The second etchant gas may include HBr, He, O$_2$ and a lower content of NF$_3$ than the first etchant gas or no NF$_3$. Alternatively, the second etchant gas includes trifluoromethane (CHF$_3$), O$_2$, and carbon tetrafluoride (CF$_4$).

The method of the present invention can be implemented as a program code stored in a computer readable storage medium. The program code controls a semiconductor wafer processing system during wafer processing. The semiconductor wafer processing system includes a processing chamber, gas panel and RF power supplies that provide source and bias signals to the plasma.

These and other embodiments of the present invention, as well as its advantages and features are described in more detail in conjunction with the text below and attached figures.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DESCRIPTION OF THE SPECIFIC EMBODIMENTS

I. Introduction

The present invention allows for profile control during deep trench etching in materials such as silicon. Deep trenches are generally trenches having depths of 0.5 microns or greater. Trenches etched by the method of the present invention are suitable for use in integrated circuits having widths of 0.35 microns or less. Also the present invention can be used to etch deep trenches in HDP chambers of conventional design. After considering the following description, those skilled in the art will realize that the teachings of the present invention can be utilized in various plasma processes for semiconductor wafer manufacturing.

II. Exemplary HDP Etch Chamber

Figure 2:
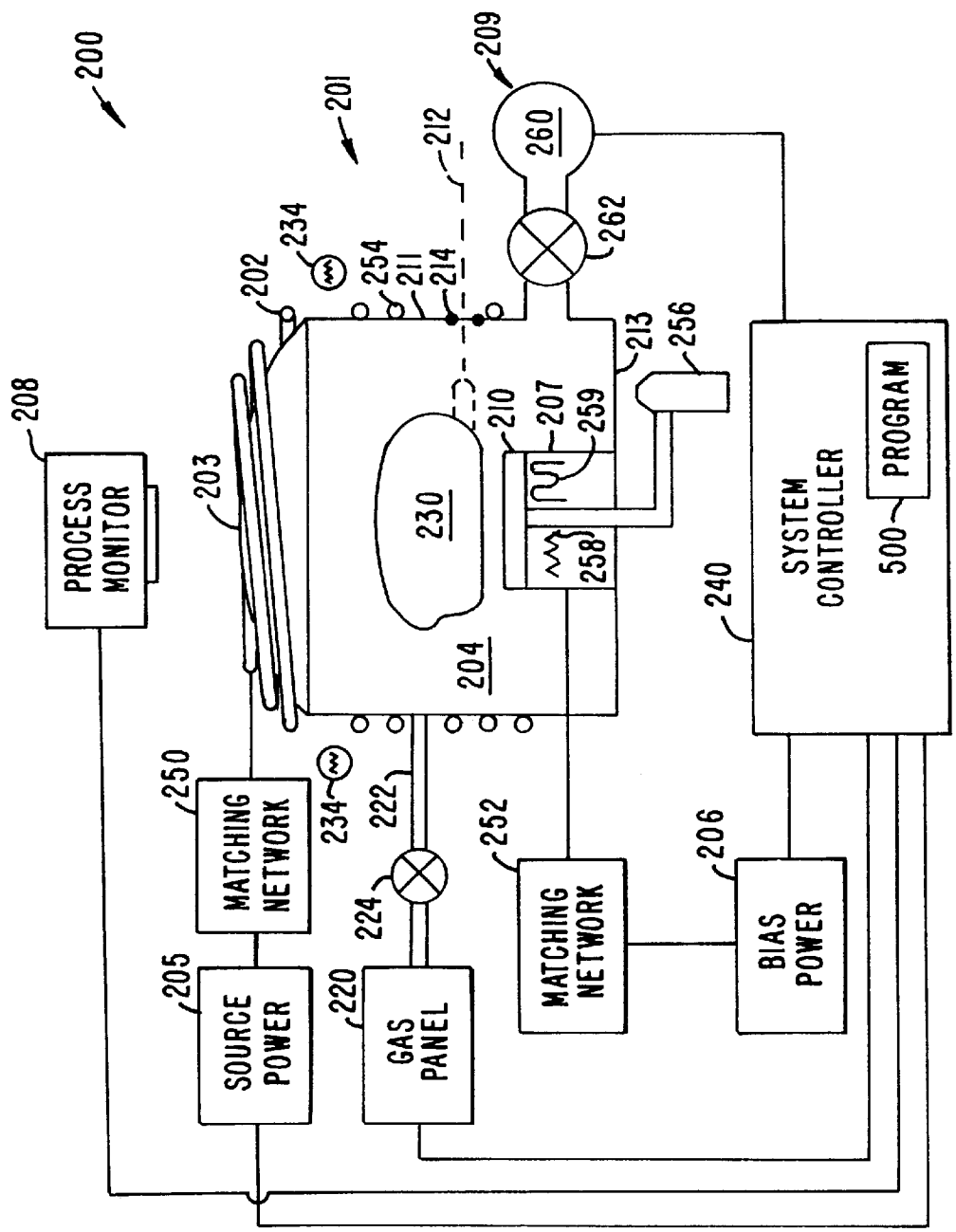
FIG. 2 shows a partial cross-sectional schematic of a semiconductor wafer processing system for implementing the method of the present invention.

FIG. 2 depicts a schematic diagram of a semiconductor wafer processing system 200 in which the method of the present invention can be practiced. The depicted system is illustratively an inductively coupled plasma etch system. The invention, however, is applicable to any HDP or inductively coupled plasma (ICP) semiconductor wafer processing system that requires clean profile control during processing of structures formed upon a semiconductor wafer.

System 200 comprises a process chamber 201, a source power supply 205, a bias power supply 206 and a controller 240. The process chamber 201 comprises a process volume 204 defined by a dome-shaped top 203, a cylindrical sidewall 211, and a bottom 213. The top 203 is typically made of a dielectric material. The sidewall 211 and bottom 213 are typically made of a metal such as aluminum or stainless steel. The source power supply 205 couples an RF signal (e.g., 12.56 MHz) to at least one inductive coil antenna 202 via a matching network 250. The antenna 202, having a plurality of turns located proximate to the top 203, produces RF electromagnetic fields that excite a process gas (or gases) located in the volume 204 to form and/or sustain a plasma 230.

During substrate processing, a semiconductor wafer 210, which may contain partially formed integrated circuit structures, is supported on a pedestal 207. The wafer 210 is exposed to the plasma to facilitate processing. Ions and electrons from the plasma 230 bombard the wafer 210. Since the electrons are more mobile than the ion, more electrons than ions strike the wafer 210. As a result the wafer 210 acquires a negative bias. The negative bias accelerates positive ions from the plasma toward the wafer 210. The accelerated ions generally etch the wafer 210 anisotropically, i.e., with a preferred direction. The pedestal 207 and thus the wafer is biased by an RF signal (e.g., 400 kHz or 13.56 MHz) supplied to the pedestal 207 by the bias power supply 206 via a matching network 252. The signal applied to the antenna mostly controls the density of ions in the plasma 230. The signal applied to the pedestal 207 mostly controls the energy of the ions.

The temperature of the chamber is controlled by heaters such as heat lamps 234, and cooling fluid flowing in conduits 254 in the sidewall 211 and/or bottom 213. Typically, a fan (not shown) provides air flow to control the temperature of the top 203. The temperature of wafer 210 is controlled by stabilizing the temperature of the pedestal 207 with a heating element 258 and/or cooling element 259. An inert backside gas from a source 256 fills interstitial spaces between the pedestal 207 and a backside of the wafer 210. The backside gas has a higher thermal conductivity than that of the vacuum it replaces thereby facilitating heat transfer between the wafer 210 and the pedestal 207.

A process monitor 208 monitors conditions within the process chamber 201. The process monitor can be any sensor, or combination of sensors, for measuring a condition that is dependent on the process occurring within the chamber 201. By way of example, the process monitor 208 is an Optical Emission Spectrometer (OES). The OES monitors emission of radiation from the plasma 230. Such radiation is dependent on the progress of the process occurring in the process chamber 201. Alternatively, the process monitor 208 could include an interferometer for measuring elevations such as the depth of trenches etched into a surface of the wafer 210. Such an interferometer measures the depth of the trenches by interference of light reflected from the top and bottom of the trenches. If the process monitor 208 is an OES or interferometer, radiation from within the chamber 201 is coupled to the process monitor 208 through a transparent aperture. The top 203 can be used as the aperture if it is made of a transparent dielectric material such as quartz. Alternatively a separate window can be provided in the top 203 or sidewall 211 for this purpose.

The process monitor 208 and various components of the system 200 are coupled to the controller 240. The controller 240 includes hardware to provide the necessary signals to initiate, monitor, regulate, and terminate the processes occurring in the process chamber 201.

The process chamber 201 is, for example, a decoupled plasma source (DPS) etch chamber manufactured by Applied Materials of Santa Clara, Calif. The chamber 201 contains the elements necessary to process a semiconductor wafer. For example, the chamber 201 includes a pedestal 207 that supports a semiconductor wafer 210 during processing. A robot arm 212, shown in phantom, transfers the wafer 210 in and out of the process chamber 201 through a slit valve 214.

The exterior of the chamber 201 is typically at ambient atmospheric pressure and the interior of the chamber 201 is held at a reduced pressure during processing. An exhaust system 209 regulates the pressure within the chamber 201. The exhaust system 209 typically includes a pump 260 and a throttle valve 262 situated between chamber 201 and the pump 260. A gas panel 220 delivers process gases to the chamber 201 via gas lines 222 and valves 224. A single line and valve are shown for clarity. In a process, such as an etch process, the plasma 230 is formed in the chamber 201 by applying RF power to the process gas. The RF power source 205 energizes the antenna 202 to ignite and sustain a plasma 230 within the chamber 201. Those skilled in the art will realize that a plurality of steps is necessary to excite a plasma in a process chamber, i.e., supply a process gas, apply source power to the antenna, apply bias power to the pedestal and so on. One of ordinary skill in the art can perform these steps without further explanation.

Figure 3:
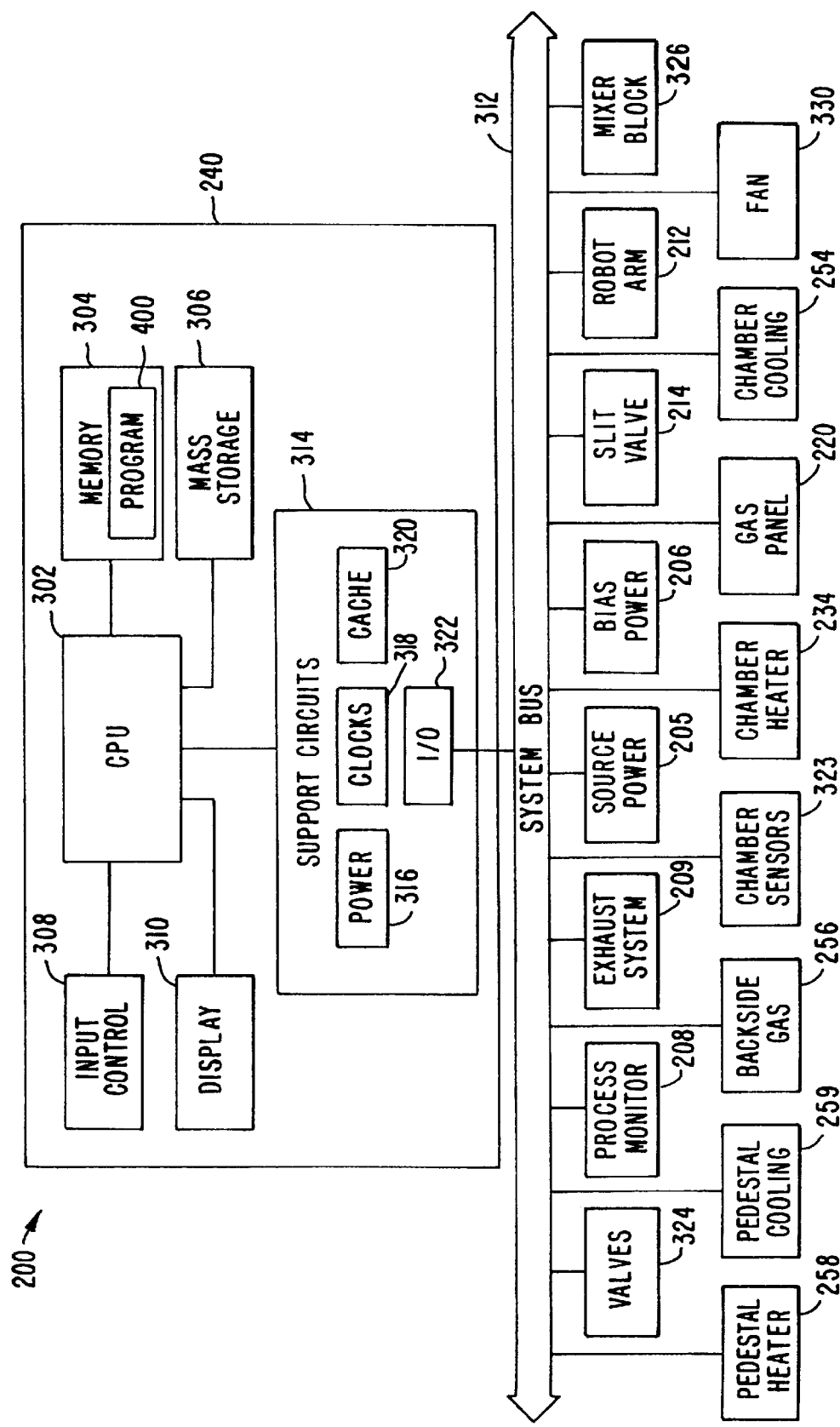
FIG. 3 shows a block diagram of the semiconductor wafer processing system of FIG. 2.

The method of the present invention can be implemented in a system that is controlled by a processor based system controller such as the controller 240 of FIG. 2. FIG. 3 shows a block diagram of such a processing system 200. The system controller unit 240 includes a programmable central processing unit (CPU) 302 that is operable with a memory 304, a mass storage device 306, an input control unit 308, and a display unit 310. The system controller further includes well-known support circuits 314 such as power supplies 316, clocks 318, cache 320, input/output (I/O) circuits 322 and the like. The controller 240 also includes hardware for monitoring wafer processing through sensors 323 in the chamber 201. Such sensors measure system parameters such as wafer temperature, chamber atmosphere pressure and the like. All of the above elements are coupled to a control system bus 312.

The memory 304 contains instructions that the CPU 302 executes to facilitate the performance of the processing system 300. The instructions in the memory 304 are in the form of program code such as a program 400 that implements the method of the present invention. The program code may conform to any one of a number of different programming languages. For example, the program code can be written in C, C++, BASIC, Pascal, or a number of other languages.

The mass storage device 306 stores data and instructions and retrieves data and program code instructions from a processor-readable storage medium, such as a magnetic disk or magnetic tape. For example, the mass storage device 306 can be a hard disk drive, floppy disk drive, tape drive, or optical disk drive. The mass storage device 306 stores and retrieves the instructions in response to directions that it receives from the CPU 302. Data and program code instructions that are stored and retrieved by the mass storage device 306 are employed by the processor unit 302 for operating the processing system 200. The data and program code instructions are first retrieved by the mass storage device 306 from a medium and then transferred to the memory 304 for use by the CPU 302.

The input control unit 308 couples a data input device, such as a keyboard, mouse, or light pen, to the processor unit 302 to provide for the receipt of a chamber operator's inputs. The display unit 310 provides information to a chamber operator in the form of graphical displays and alphanumeric characters under control of the CPU 302.

The control system bus 312 provides for the transfer of data and control signals between all of the devices that are coupled to the control system bus 312. Although the control system bus is displayed as a single bus that directly connects the devices in the CPU 302, the control system bus 312 can also be a collection of buses. For example, the display unit 310, input control unit 308 and mass storage device 306 can be coupled to an input-output peripheral bus, while the CPU 302 and memory 304 are coupled to a local processor bus. The local processor bus and input-output peripheral bus are coupled to form the control system bus 312.

The system controller 240 is coupled to the elements of the processing system 200, employed in etch processes in accordance with the present invention via the system bus 312 and the I/O circuits 322. These elements include the following: a plurality of valves 324 (such as valve 224 of FIG. 2), the process monitor 208, the exhaust system 209, the source power supply 205, the bias power supply 206, the slit valve 214, the gas panel 220, the robot arm 212, the chamber sensors 323, the chamber heater 234, the chamber cooling system 254, the backside gas source 256, the pedestal heater 258 and cooling element 259, the fan 330 and an optional mixer block 326 (not shown in FIG. 2, but may be connected to either the gas panel 220 or chamber 201). The system controller 240 provides signals to the chamber elements that cause these elements to perform operations for forming a layer of copper in the subject apparatus.

Although the invention is described herein as being implemented in software and executed upon a general purpose computer, those skilled in the art will realize that it would be a matter of routine skill to select an appropriate computer system to control processing system 200. Those of skill in the art will also realize that the invention could be implemented using hardware such as an application specific integrated circuit (ASIC) or other hardware circuitry. As such, it should be understood that the invention can be implemented, in whole or in part, in software, hardware or both.

III. Forming Trenches According to the Present Invention

It has not heretofore been recognized in the art that changing the amount of $NF_3$ in a high density plasma controls the feature profile during processes such as deep trench etching. The present invention introduces $NF_3$ into a high density plasma silicon etch process, and it is speculated that high density plasma more efficiently dissociates nitrogen from the $NF_3$ to form more free nitrogen than occurs in lower density plasma processes. The free nitrogen reacts with the $O_2$ from the plasma and silicon from the wafer to form silicon oxynitrides ($Si_xO_yN_z$, where x, y and z are integers). The amount of $Si_xO_yN_z$ formed controls the trench profile. Although the mechanism described above appears to be a plausible explanation for the observed effects, other mechanisms cannot be ruled out and the invention is not limited to any specific theory.

Using this discovery, the inventors developed an improved method of forming deep trenches in silicon. The inventive method controls the profile of trenches during silicon etch while minimizing contamination to a chamber such as chamber 201. The inventive method uses nitrogen trifluoride ($NF_3$) in the plasma 230 to control the profile of the trenches during silicon etch. It has been found that the profile can be controlled by changing the amount of $NF_3$ in the plasma 230. Generally, the more $NF_3$ in the plasma 230 the smaller (i.e., less vertical) the angle of taper of the sidewalls of the trench. To etch a trench having a smaller angle of taper at the top than at the bottom the flow of $NF_3$ is reduced part way through the etch process.

Figure 1:
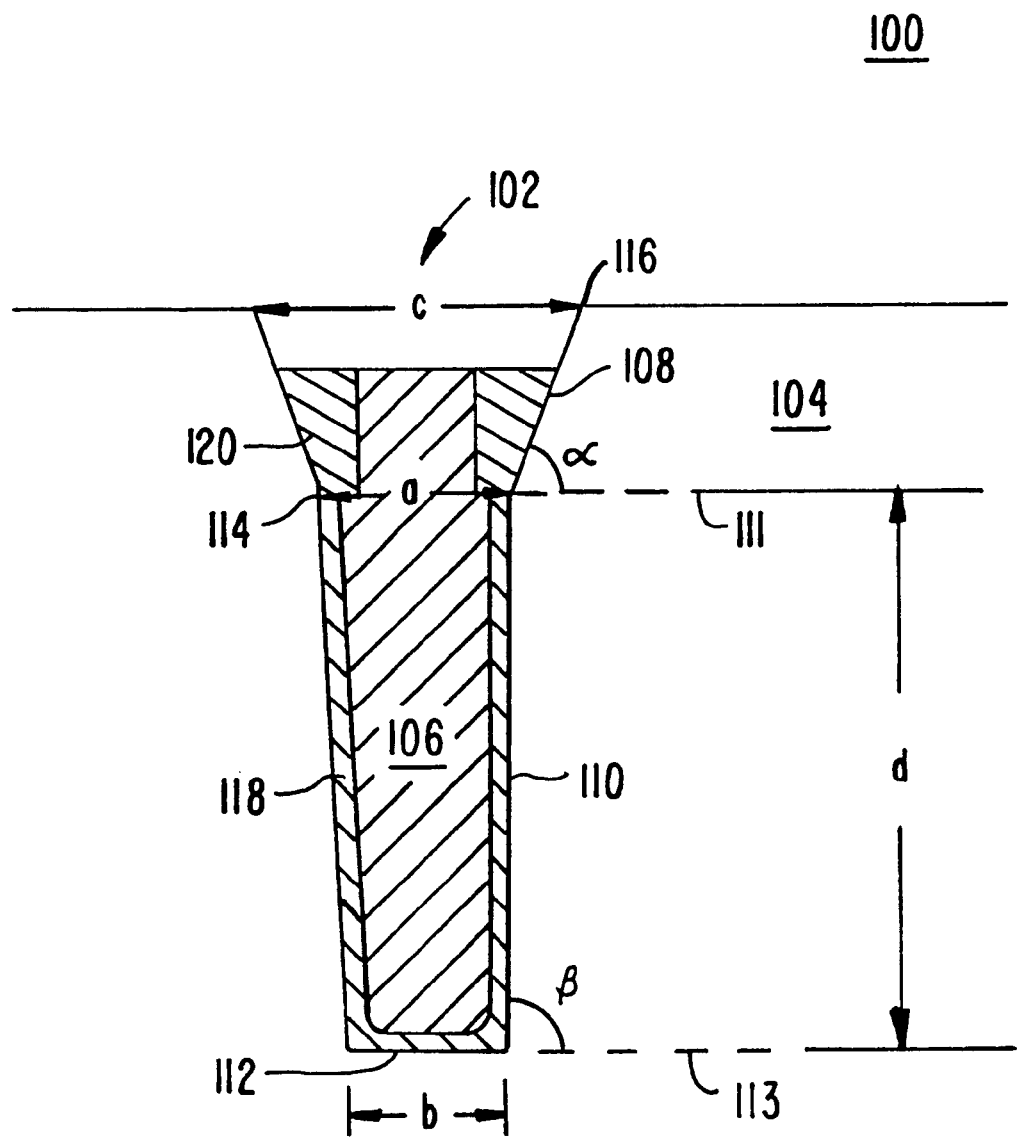
FIG. 1 shows a cross section of a partially formed trench capacitor of the prior art.
Figure 4:
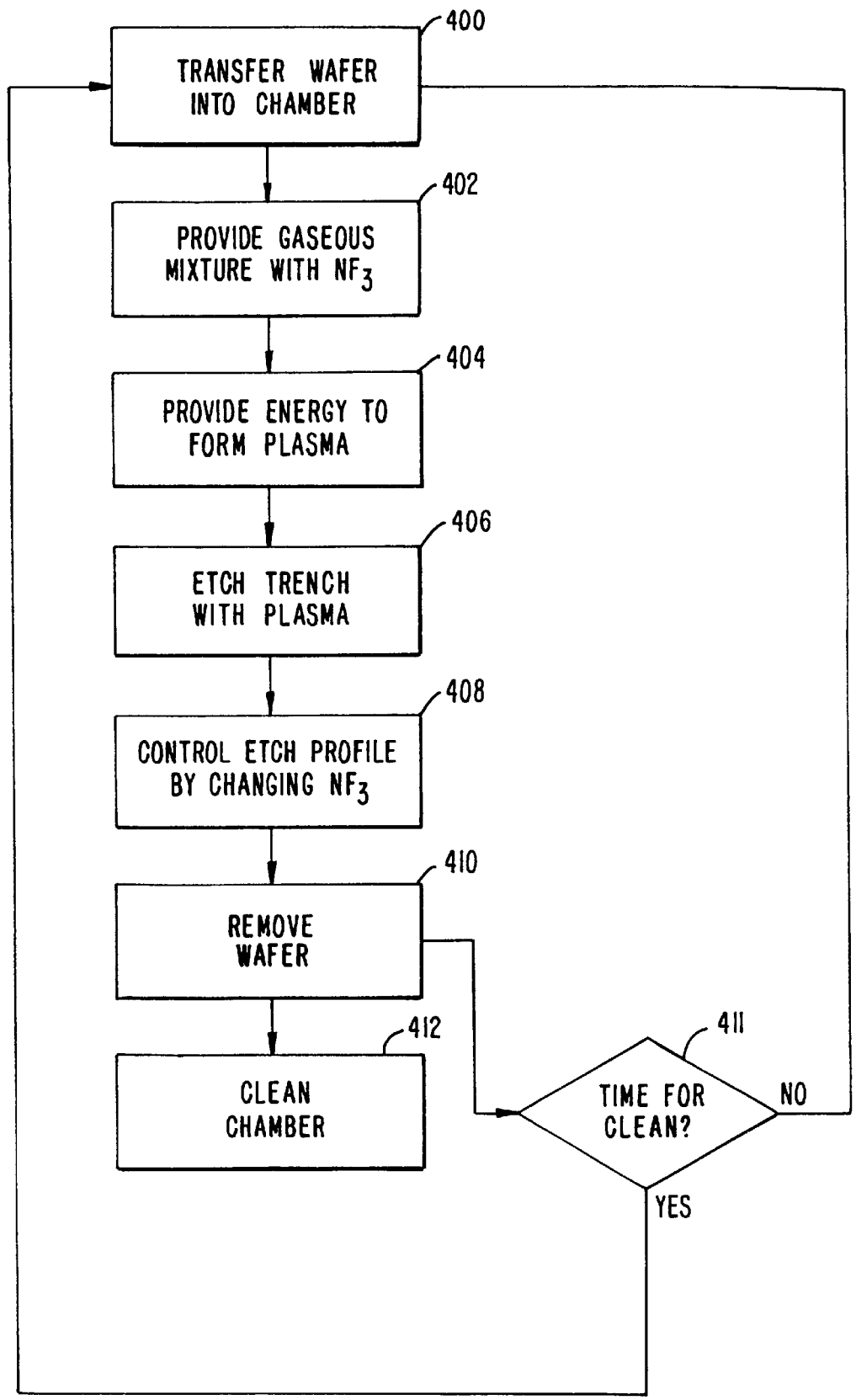
FIG. 4 shows a flow diagram of a preferred embodiment of the present invention.

FIG. 4 illustrates a preferred embodiment of the method of the present invention. By this method, structures such as the trench 102 of FIG. 1 can be etched. At step 400 a wafer is introduced to a chamber. The method includes a step 402 of providing a gaseous mixture containing nitrogen trifluoride ($NF_3$) to the chamber. $NF_3$ is included in a gaseous mixture with HBr, and $He/O_2$ to form plasma. Alternatively, the gaseous mixture can include sulfur hexafluoride ($SF_6$). The $O_2$ is typically diluted with He when the process is sensitive to $O_2$. Alternatively, other inert gases could be used in lieu of He to dilute the $O_2$. Such inert gases include argon (Ar) krypton (Kr), neon (Ne), and xenon (Xe). Helium is preferred because it is light. Heavier inert gases can cause sputtering which is often undesirable. The heavier inert gases could be used in applications where sputtering is not an issue or where sputtering is a desired effect.

At step 404 energy provided to the to gaseous mixture forms a high density plasma proximate to the substrate. In HDP the plasma density is greater than $10^{11}$ charged particles/cm$^3$ and generally between $1 \times 10^{12}$ and $5 \times 10^{13}$ ions/cm$^3$. More It is preferable for the present invention that the high density plasma has an ion density of at least $10^{12}$ ions/cm$^3$. HDP typically requires pressures of between 2 and 50 millitorr. The plasma etches the substrate at step 406 to form an upper portion of trench 102. The amount of $NF_3$ in the plasma controls the angle $\alpha$ of upper sidewall 108 of trench 102. After etching the upper portion the amount of $NF_3$ in the plasma is changed at step 408 and the plasma etches a lower portion of trench 102. The amount of $NF_3$ in the plasma controls the angle $\beta$ of sidewall 110. By reducing the amount of $NF_3$, shutting off the $NF_3$, or appropriately changing the etch chemistry, the plasma etches sidewall 110 more vertically. After etching is completed, the wafer is removed at step 410. At step 411 a decision is made to either clean the chamber at step 412 or start the process over with a new wafer at step 400.

Figure 5:
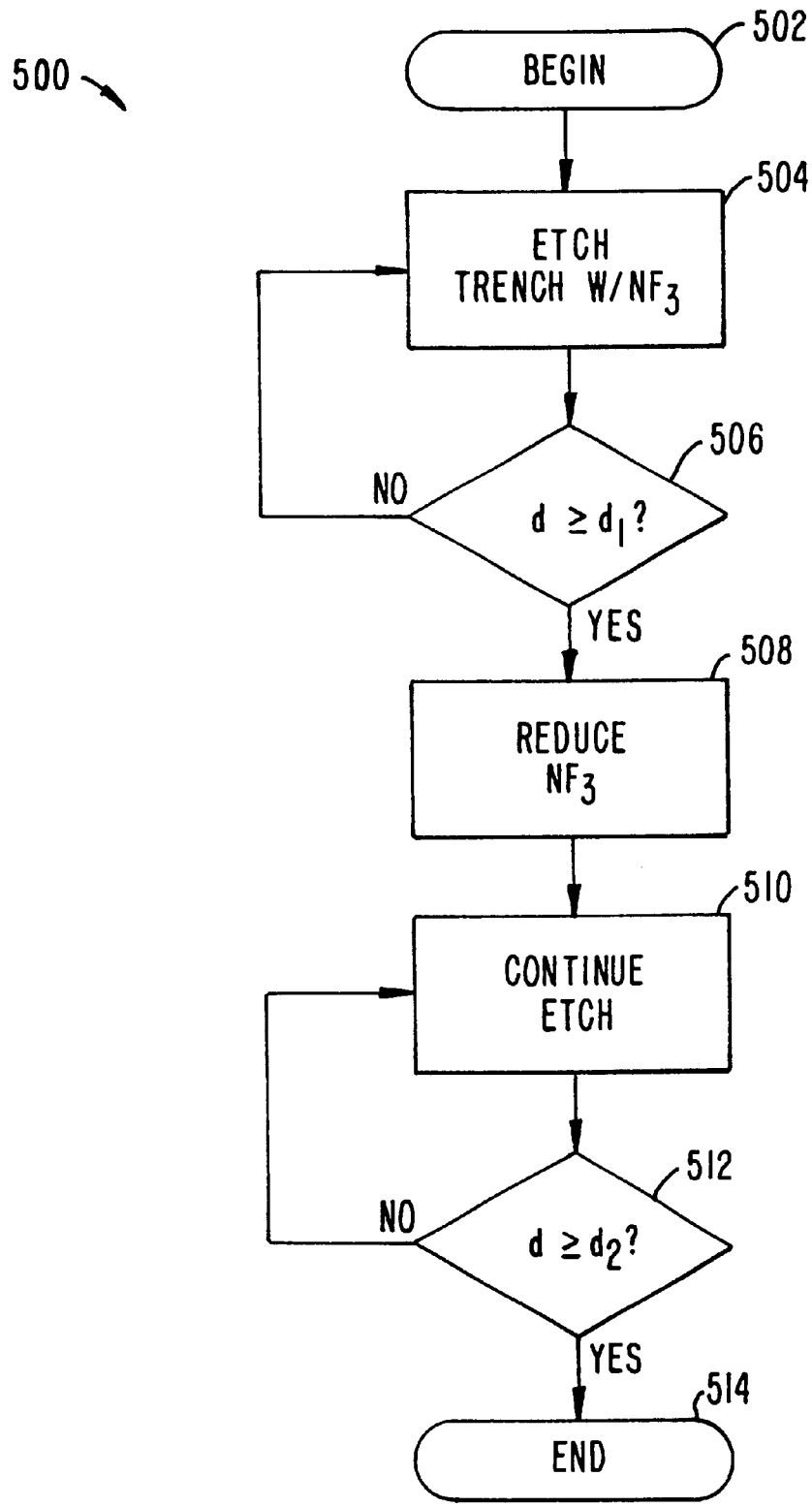
FIG. 5 shows a flow chart of a computer program that implements the method of the present invention.

Those skilled in the art would be readily able to devise a computer program to implement the present invention. FIG. 5 is a flowchart showing the method of the invention implemented in an in-situ process under the control of a computer program. The program 500 begins, at step 502, with the introduction of a substrate into the process chamber 201. For example the program 500 executes computer instructions that cause the robot arm 212 to insert the wafer 210 through the slit valve 214 and place the wafer 210 on the pedestal 207. A subsequently executed set of instructions retracts the robot arm 212 through the slit valve 214 and closes the slit valve 214.

Next, in step 504, wafer processing begins. For example, the program 500 executes a set of computer instructions that cause the gas panel 220 to introduce a process gas mixture into the main chamber 201. Additional instructions cause the RF power supply 205 to supply a source RF signal to the antenna 202. The RF signal ignites and sustains the plasma 230 within the chamber 201. Further instructions cause the bias power supply 206 to apply a bias RF signal to the pedestal 207. Other instructions cause the pedestal heater 258, cooling element 259 and backside gas source to regulate the temperature of the wafer 210.

For deep trench silicon etch, a gas mixture comprising HBr, $He/O_2$ in a 70/30 ratio, and $NF_3$, is typically provided to the chamber at a pressure of between approximately 30 and 50 millitorr. The gases are provided at a flow rates of between 50 and 300 standard cubic centimeters per minute (sccm) for HBr, between 10 and 50 sccm for $He/O_2$, and between 0 and 10 sccm for $NF_3$. The source RF signal typically has a frequency of approximately 2 to 20 megahertz (MHz) and a power of between 400 and 4000 watts. The bias RF signal typically has a frequency of approximately 200 kilohertz (kHz) to 20 MHz and a power of between 25 and 250 watts. The wafer temperature is typically maintained at between 10° C. and 50° C.

Once processing commences, the program 500 monitors conditions within the chamber 201 by referring, for example, to a signal from the process monitor 208. For example, at step 506, the program 500 executes computer instructions that compare the process monitor signal indicating the etch depth d to predetermined signal indicating a first desired etch depth $d_1$. The program 500 continues processing until the etch depth d equals the first desired etch depth $d_1$. Alternatively, the program 500 can continue processing for a predetermined period of time $T_1$. Such timing can be accomplished by comparing $T_1$ to a time T measured by the clock 318.

The trench profile can be changed in a subsequent etch in a second plasma having a different concentration of $NF_3$. Wafer 210 need not be removed from chamber 201, step when varying the flow rate of $NF_3$. For example, when the desired etch depth has been reached the program 500 executes, at step 508, computer instructions that signal the gas panel 220 to reduce the flow of NF$_3$ to the chamber 201. The flow can be reduced without stopping the RF power to form the second plasma. Alternatively the plasma can be stopped, the NF$_3$ flow rate reduced, and a second plasma ignited before processing continues. With a reduced flow of NF$_3$, the plasma etches the trench with a larger angle (i.e., a more vertical sidewall). Reduced flow refers herein to a flow of NF$_3$ that is smaller relative to the NF$_3$ flow for the prior etch step or, alternatively, no NF$_3$ at all. Additionally, the plasma can be stopped, wafer 210 can be transferred from the chamber via slit valve 214 to another chamber for a different process and then transferred back to chamber 201 for subsequent etch with a second plasma.

Etching continues at step 510. At this step other process parameters may be changed as required by the process recipe. Such parameters include source power, bias power, wafer temperature, process gas flow rates, etc. The process chemistry can be completely changed at this point. For example, SF$_6$ can be added to the HBr/NF$_3$/He/O$_2$ etch chemistry. Alternatively an etch chemistry of trifluoromethane (CHF$_3$), oxygen (O$_2$) and carbon tetrafluoride (CF$_4$) can be substituted.

The program 500 monitors the progress of the subsequent etch until a desired final etch depth is reached. For example, at step 512, the program 500 executes a set of instructions that compares the process monitor signal to a second predetermined signal indicating a second desired etch depth d$_2$. The program 500 continues processing until the measured etch depth d is equal to the second etch depth d$_2$. Alternatively, the program 500 can continue processing for a second predetermined period of time T$_2$. The program then ends at step 514. The execution of these instructions results in the elements of the processing system 200 being operated to perform a process, such as a deep trench etch, on a semiconductor wafer.

Although a two-step etch process has been described herein with reduced NF$_3$ content in a second etch step, those skilled in the art will recognize that the NF$_3$ flow could be increased in the second etch step to get a different desired profile. Additionally etch processes involving three or more sequential etch steps, each having a different NF$_3$ concentrations or different etch chemistries are within the scope of the present invention.

IV. Experimental Results

Figure 6A:
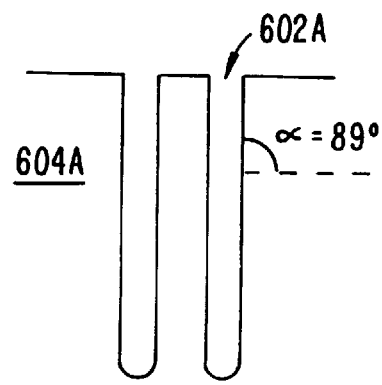
FIG. 6A shows a cross section of a trench etched in a semiconductor wafer without NF$_3$.
Figure 6B:
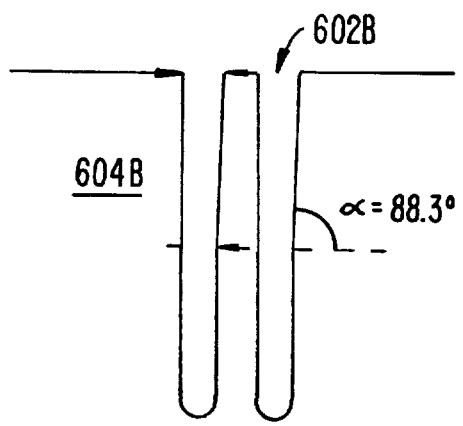
FIGS. 6B–6C show cross sections of trenches etched in semiconductor wafers using NF$_3$ according to the method of the present invention.
Figure 6C:
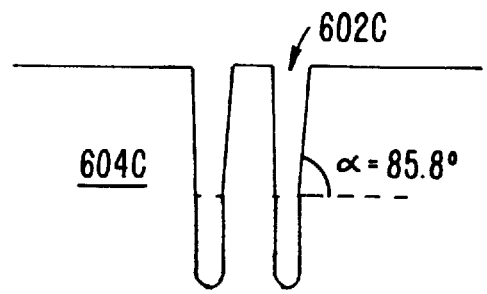

The advantage of NF$_3$ during HDP wafer etching is readily apparent from the trench cross sections depicted in FIGS. 6A–6C. In each case trenches 602A, 602B and 602C were etched in silicon substrates 604A, 604B and 604C. In each cross section, an Si$_x$O$_y$ hardmask overlying the silicon substrates had already been etched using a CHF$_3$/O$_2$/CF$_4$ etch chemistry. The CF$_4$ etches the Si$_x$O$_y$, the O$_2$ enhances the dissociation of fluorine and the CHF$_3$ controls the etch selectivity. In addition, a photoresist overlying the hard mask had been stripped prior to etching trenches 602A, 602B and 602C.

The trenches 602B, 602C depicted in FIGS. 6B and 6C were etched in silicon substrates 604B, 604C according to the method of the present invention. In FIG. 6B NF$_3$ was provided at a flow rate of 3 sccm. In FIG. 6C NF$_3$ was provided at a flow rate of 5 sccm. The trenches depicted in FIG. 6A, by contrast, were etched without NF$_3$. In each case HBr was provided at 240 sccm and He/O$_2$ in a 70/30 ratio was provided at 32 sccm. The chamber pressure was 40 millitorr. Source power was applied a rate of 1800 watts. Bias power was applied at a rate of 250 watts. The results are summarized in Table I below.

TABLE I

| FIG. | NF$_3$ FLOW RATE (sccm) | TRENCH DEPTH (microns) | SIDEWALL ANGLE α |
|---|---|---|---|
| 6A | — | 1.6 | 89° |
| 6B | 3 | 1.7 | 88.4° |
| 6C | 5 | 1.2 | 85.8° |

Note that the sidewall angle α is reduced (i.e., made less vertical) as the NF$_3$ flow rate is increased. It has been found that if too much NF$_3$ is added, i.e., more than about 10 sccm, the etch process eats away at the sidewalls of the trenches. However this may be a desirable effect in some applications. The gas flow rates described above are based on etch processes run in a DPS chamber manufactured by Applied Materials that is outfitted for 200 mm wafers. A person of ordinary skill in the art will recognize that the rates at which various gases in the etchant gas are introduced are in part chamber specific and will vary if chambers of other design and/or volume are employed.

Typical etch rates achieved with the method of the present invention are 10,000 Å/min at the top of the trench and approximately 7000 Å/min at the bottom. The lower etch rate at the bottom is due to the narrower width of the trench there. The method of the present invention can etch trenches having depths of 20 microns or more and aspect ratios of up to approximately 20:1. In addition, as many as 1000 wafers can be etched between chamber cleanings.

The present invention can be used in various deep trench etch applications such as forming trench capacitors in DRAM's or isolation trenches between transistors. Although various embodiments which incorporate the teachings of the present invention have been shown and described in detail herein, those skilled in the art can readily devise many other varied embodiments that still incorporate these teachings.

What is claimed is:

1. A method for controlling a profile of a trench etched in a silicon substrate, said method comprising:
    (a) flowing an etchant gas containing nitrogen trifluoride (NF$_3$);
    (b) providing energy to said etchant gas to form a plasma proximate to the substrate;
    (c) etching the substrate with said plasma to form the trench; and
    (d) changing an amount of said NF$_3$ in said etchant gas to control the profile of the trench.
2. The method of claim 1 wherein said plasma is a high density plasma (HDP).
3. The method of claim 2 wherein said HDP has an ion density of at least 10$^{12}$ ions/cm$^3$.
4. The method of claim 1 wherein said etching step includes a silicon etch process.
5. The method of claim 4 wherein said silicon etch process is a deep trench etch process.
6. The method of claim 1 further comprising the step of:
    (e) repeating steps (a)–(d) at least once before cleaning a chamber in which said steps (a)–(d) occur.
7. A method for etching a trench in a silicon substrate, said method comprising:
    flowing a first etchant gas containing nitrogen trifluoride (NF$_3$) to a substrate processing chamber;
    forming a first high density plasma within said chamber to etch a trench on the silicon substrate;
    thereafter, flowing a second etchant gas to said chamber, said second etchant gas having a reduced content of NF$_3$ relative to said first etchant gas or no NF$_3$;

forming a second high density plasma with said second etchant gas; and etching said trench further with said second high density plasma.

8. The method of claim 7 wherein said first etchant gas further includes hydrogen bromide (HBr) and oxygen ($O_2$) and an inert gas.

9. The method of claim 8 wherein said high density plasma has an ion density of at least $10^{12}$ ions/ cm$^3$.

10. The method of claim 7 wherein said trench has an upper wall that forms a first angle with a horizontal.

11. The method of claim 10 wherein said second plasma etches said trench such that said trench has said upper wall and a lower wall that forms a second angle with the horizontal, said second angle being greater than said first angle.

12. The method of claim 10 wherein said first angle is less than 89°.

13. The method of claim 7 wherein said second etchant gas includes HBr and sulfur hexafluoride ($SF_6$) and $O_2$.

14. The method of claim 11 wherein said second angle is less than or equal to 89°.

15. A method for etching a trench in a silicon substrate, said method comprising:

flowing a first etchant gas containing hydrogen bromide (HBr), nitrogen trifluoride ($NF_3$), helium (He) and oxygen ($O_2$) to a substrate processing chamber;

forming a high density plasma within said chamber to etch an upper portion of a trench in the silicon substrate, wherein said upper portion has a first sidewall angle that is less than 89° with respect to a horizontal;

thereafter, etching a lower portion of the trench, wherein said lower portion has a second sidewall angle that is greater than said first sidewall angle with respect to the horizontal.

16. The method of claim 15 wherein said lower portion of said trench is etched with a high density plasma formed from a second etchant gas and wherein said second etchant gas includes HBr, He, $O_2$ and $NF_3$, wherein said second etchant gas has a lower content of $NF_3$ than said first etchant gas.

17. The method of claim 15 wherein said lower portion of said trench is etched with a high density plasma formed from a second etchant gas and wherein said second etchant gas consists essentially of HBr, He, $O_2$.

18. The method of claim 15 wherein said lower portion of said trench is etched with a high density plasma formed from a second etchant gas and wherein said second etchant gas includes trifluoromethane ($CHF_3$), $O_2$, and carbon tetrafluoride ($CF_4$).

19. The method of claim 15 wherein said first etchant gas consists essentially of HBr, $NF_3$, helium and oxygen.

20. The method of claim 16 wherein said second etchant gas consists essentially of HBr, $NF_3$, helium and oxygen.

21. A computer readable storage medium having program code embodied therein, said program code for controlling a semiconductor wafer processing system, wherein said semiconductor processing system includes a chamber and a power supply, said program code controlling the semiconductor processing system to process a wafer in the chamber in accordance with the following:

flowing a gaseous composition containing nitrogen trifluoride ($NF_3$) to the chamber;

providing energy to the gaseous composition to form a high density plasma within said chamber;

processing the substrate with said high density plasma; and changing an amount of said $NF_3$ in said gaseous mixture.

22. Apparatus for processing a semiconductor wafer, comprising:

a processing chamber;

a gas panel coupled to said processing chamber;

an antenna proximate to said processing chamber a power supply coupled to said antenna; and a controller, coupled to said antenna and said gas panel, said controller containing a computer readable storage medium having program code embodied therein, said program code for controlling the apparatus in accordance with the following:

flowing a gaseous composition containing nitrogen trifluoride ($NF_3$) from the gas panel to the chamber;

providing energy from the power supply to the antenna to form a high density plasma within said chamber;

processing the wafer with said high density plasma; and changing an amount of said $NF_3$ in said gaseous mixture.

* * * * *